United States Patent
Ohtani

(10) Patent No.: US 7,439,156 B2
(45) Date of Patent: Oct. 21, 2008

(54) METHOD FOR MANUFACTURING SEMICONDUCTOR DEVICE

(75) Inventor: Kinya Ohtani, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 421 days.

(21) Appl. No.: 11/404,765

(22) Filed: Apr. 17, 2006

(65) Prior Publication Data

US 2006/0234471 A1    Oct. 19, 2006

(30) Foreign Application Priority Data

Apr. 18, 2005  (JP)  ............................... 2005-120319
Apr. 11, 2006  (JP)  ............................... 2006-108626

(51) Int. Cl.
   *H01L 21/76*   (2006.01)
(52) U.S. Cl. .................. 438/432; 438/259; 438/430
(58) Field of Classification Search ................ 438/242, 438/259, 270–271, 361, 430–432; 257/E21.197, 257/E21.564, E21.585

See application file for complete search history.

(56) References Cited

U.S. PATENT DOCUMENTS 7,397,082 B2 *   7/2008   Takemori et al. ............ 257/329

FOREIGN PATENT DOCUMENTS

JP          6-314739       11/1994

* cited by examiner

*Primary Examiner*—Thanhha Pham
(74) *Attorney, Agent, or Firm*—Young & Thompson

(57) ABSTRACT

A semiconductor device and method of manufacturing the same. The method includes: forming a trench in a silicon substrate; forming a first insulating film on a surface of the silicon substrate, the surface including an interior wall of the trench; forming a polysilicon film which plugged in the trench and covered on an entire surface of the silicon substrate; forming a second insulating film with oxidizing a portion of the polysilicon film disposed outside of the trench, and oxidizing a surface region of the silicon substrate located beneath the first insulating film disposed outside of the trench and a surface region of the polysilicon film in the trench; and forming an embedded polysilicon layer by removing the second insulating film so that the surface of the silicon substrate is partially exposed and the polysilicon film partially remains in the trench.

5 Claims, 7 Drawing Sheets

METHOD FOR MANUFACTURING SEMICONDUCTOR DEVICE

This application is based on Japanese patent application Nos. 2005-120,319 and 2006-108626, the contents of which are incorporated hereinto by reference.

BACKGROUND

1. Field of the Invention

The present invention relates to a method for manufacturing a semiconductor device.

2. Related Art

Conventional methods for manufacturing an embedded polysilicon layer typically includes a method described in, for example, Japanese Patent Laid-Open No. H06-314,739 (1994). The method for manufacturing the polysilicon layer described in Japanese Patent Laid-Open No. H06-314,739 is shown in FIGS. 6A to 6C and FIGS. 7D to 7F.

First of all, a trench 113 is formed in a silicon substrate 110. Thereafter, a p-type diffusion layer (not shown) and an n-type diffusion layer (not shown) are formed in predetermined locations of the silicon substrate 110. Then, a silicon oxide film 112 is formed on surfaces of a silicon substrate 110 that includes an interior wall of a trench 113 via a thermal oxidation process (FIG. 6A).

Subsequently, a polysilicon film 114 is formed on the surface of the silicon oxide film 112 via a chemical vapor deposition (CVD) process. The polysilicon film 114 is formed so as to plug the trench 113 and to cover the entire surface of the silicon oxide film 112. A dip 114a is formed in a position located above the trench 113 in an upper surface of the polysilicon film 114 (FIG. 6B). Next, a silicon nitride film 116 is formed to cover the entire surface of the polysilicon film 114 via the CVD process (FIG. 6C).

Then, the silicon nitride film 116 is etched. As a result, the silicon nitride film 116a partially remains only in the dip 114a (FIG. 7D). Next, the a top surface of the polysilicon film 114 is oxidized, and further, the formed oxide-film (not shown) is removed. In this case, a phenomenon that an oxidization of the polysilicon film 114 does not proceed from the silicon nitride film 116a remained in the dip 114a is utilized, so that the depth of the dip 114a is reduced to planarize the polysilicon film 114 (FIG. 7E). Then, the polysilicon film 114 is etched to form an embedded polysilicon layer 115 in the trench 113 (FIG. 7F).

However, in the conventional technology described in Japanese Patent Laid-Open No. H06-314739, the additional process for forming the embedded polysilicon layer 115 causes a very complicated situation. More specifically, the following processes are required for planarizing the surface of the embedded polysilicon layer 115 formed in the trench 113:

a silicon nitride film 116 is formed on the polysilicon film 114 (FIG. 6C), and further, the silicon nitride film 116 is etched (FIG. 7D), and thereafter, an oxidization of the polysilicon film 114 is progressed until the oxidization is reached to a specified location (i.e., bottom of dip 114a). Further, since the p-type diffusion layer (not shown) and the n-type diffusion layer (not shown) are formed in the silicon substrate 110, a countermeasure for a prevention from an oxidization of the silicon substrate 110 should be taken. More specifically, a countermeasure for a prevention from an oxidization of the silicon substrate 110 is described in example 2 of Japanese Patent Laid-Open No. H06-314,739, in which a silicon nitride film is provided as an etch stop film in the polysilicon film 114 to prevent the oxidization of the silicon substrate 110. As such, the process for forming the embedded polysilicon layer 115 causes very complicated situation, and further, it is very difficult to appropriately control a geometry of the embedded polysilicon layer 115. In addition, it is also difficult to achieve a sufficient planarization of the surface of the embedded polysilicon layer 115, and thus concave and convex portions are still remained in the surface. Therefore, a problem is occurred, when the embedded polysilicon layer 115 is employed for the device isolation layer, an interconnect formed on the surface of the embedded polysilicon layer 115 is easily be broken.

On the contrary, when a method other than the method described in Japanese Patent Laid-Open No. H06-314739 is employed to form the embedded polysilicon layer 115 as the polysilicon gate electrode, threshold voltage of a transistor may fluctuate. Problems occurred when methods for manufacturing the device other than the above-described method will be described as follows, in reference to FIGS. 4A to 4C and FIGS. 5D and 5E.

First of all, a trench 113 is formed in a silicon substrate 110 via an exposure technology and an etching technology. Then, a silicon oxide film is formed onto an interior wall of the trench 113 via a thermal oxidation process or the like. This provides a silicon oxide film 112 formed on the surface of the silicon substrate 110 including the interior wall of the trench 113 (FIG. 4A). Subsequently, a polysilicon film 114 is formed on the surface of the silicon oxide film 112 via a CVD process. The polysilicon film 114 is formed so as to plug the trench 113 and to cover the entire surface of the silicon oxide film 112 (FIG. 4B).

Then, the polysilicon film 114 on the silicon oxide film 112 is etched back to be removed therefrom. Such etching back process provides an embedded polysilicon layer 115 formed in the trench 113. In this case, an excessive etching (i.e., over etching) may be required for compensating a positional variation in the levels (heights) of surface in the silicon substrate 110 and/or a difference in etching rates. Therefore, a surface of the embedded polysilicon layer 115 may often be isolated from the surface of the silicon substrate 110 in the trench 113, resulting in partially exposing an interior wall 113a of the trench 113 (FIG. 4C).

Then, an n-type impurity is doped into the silicon substrate 110 through a mask of the embedded polysilicon layer 115 and the silicon oxide film 112, which are formed in the trench 113 (FIG. 5D). This provides a pair of n-type diffusion layers 118 formed in surface regions of the silicon substrate 110 located aside of the trench 113, and additionally, unwanted doping with the impurity is simultaneously carried out from the interior wall 113a of the trench 113. This provides an anomalous diffusion region 118a formed in the n-type diffusion layer 118, which is formed to have larger dimension than the planned dimension for forming the n-type diffusion layer 118 (FIG. 5E). Therefore, a fluctuation in threshold voltage of the transistor is increased, leading to a deterioration in electrical characteristics of the semiconductor device.

As described above, it is very difficult to precisely control the geometry of the polysilicon gate electrode 115, when the embedded polysilicon layer (polysilicon gate electrode) 115 is formed in the trench 113. Therefore, a novel process is required, which allows forming a polysilicon gate electrode with a simple and easy process, and which allows providing a semiconductor device having stable electrical characteristics provided by stabilizing a threshold voltage of a transistor.

SUMMARY OF THE INVENTION

According to one aspect of the present invention, there is provided a method for manufacturing a semiconductor device, comprising: forming a trench in a silicon substrate; forming a first insulating film on a surface of said silicon substrate, said surface including an interior wall of said trench; forming a polysilicon film which plugged in said trench and covered on an entire surface of said silicon substrate; forming a second insulating film with oxidizing a portion of said polysilicon film disposed outside of said trench, and oxidizing a surface region of said silicon substrate located right under said first insulating film disposed outside of said trench and a surface region of said polysilicon film in said trench; and forming an embedded polysilicon layer with removing said second insulating film so that the surface of said silicon substrate is partially exposed and said polysilicon film is partially remained in said trench.

In the method for manufacturing the semiconductor device according to the above-described aspect of the present invention, the surface of the embedded polysilicon layer can be substantially planarized via a simple and easy process. Therefore, when the embedded polysilicon layer is employed for a device isolation layer, an improved connecting reliability of an interconnect can be presented. Further, according to the process for manufacturing the semiconductor device, the surface of the embedded polysilicon layer formed in the trench and the surface of the silicon substrate are formed to be substantially coplanar, and therefore the interior wall of the trench is not exposed. Therefore, when the embedded polysilicon layer is employed for the polysilicon gate electrode, a pair of source regions, which are planned to be formed in the surface regions of the silicon substrate located aside of the trench, are formed in regions as originally designed. That is, according to the present invention, stable threshold voltage of a transistor is achieved with a simple and easy process, and therefore a semiconductor device having stable electrical characteristics can be provided.

According to the method for manufacturing the semiconductor device of the present invention, a semiconductor device having an improved connecting reliability of an interconnect can be obtained via a simple and easy process, and further, a semiconductor device having a stable threshold voltage of a transistor and a stable electrical characteristic can also be obtained.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

Figure 1A:
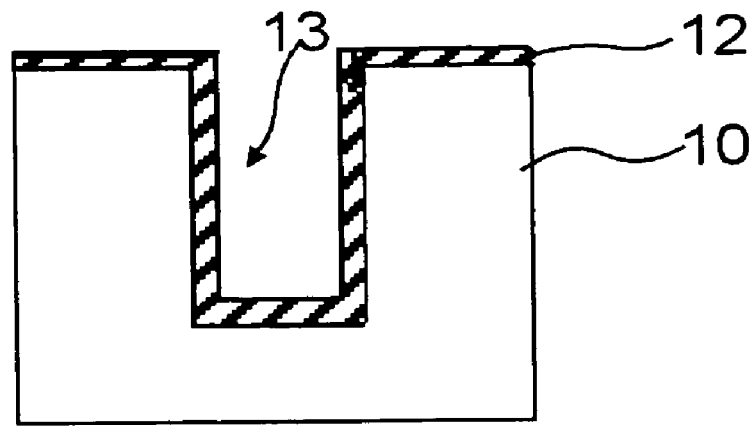
FIGS. 1A to 1C are cross-sectional views of a semiconductor device according to the present invention, schematically illustrating a process for manufacturing the semiconductor device according to an embodiment.
Figure 1B:
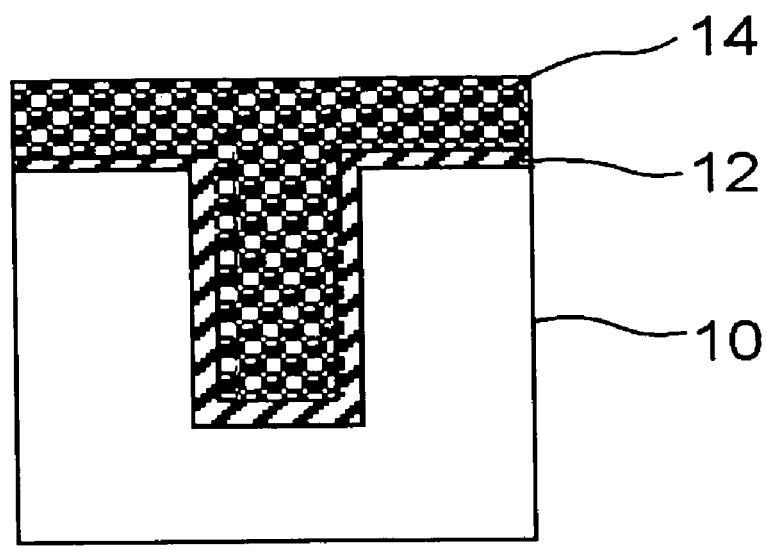
Figure 1C:
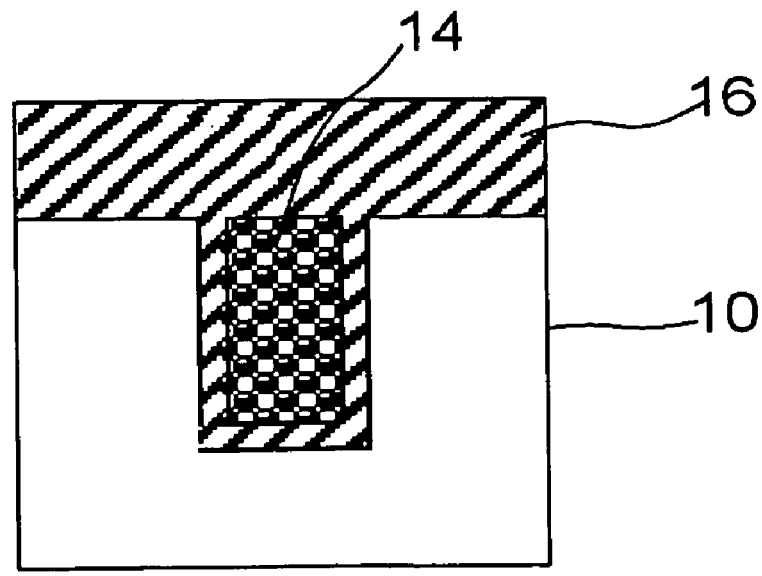
Figure 2D:
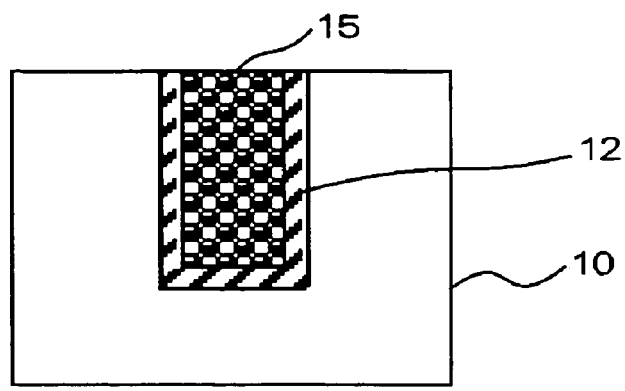
FIGS. 2D to 2F are cross-sectional views of the semiconductor device according to the present invention, schematically illustrating the process for manufacturing the semiconductor device according to the embodiment.

A method for manufacturing a semiconductor device according to the present embodiment comprises: forming a trench 13 in a silicon substrate 10; forming a first insulating film (first silicon oxide film 12) on a surface of the silicon substrate 10 including an interior wall of the trench 13 (FIG. 1A); forming a polysilicon film 14 which plugged in the trench 13 and covered on an entire surface of the silicon substrate 10 (FIG. 1B); forming a second insulating film (second silicon oxide film 16) with oxidizing a portion of the polysilicon film 14 disposed outside of the trench 13, and oxidizing a surface region of the silicon substrate located right under the first insulating film (first silicon oxide film 12) disposed outside of the trench 13 and a surface region of the polysilicon film 14 in the trench 13 (FIG. 1c); and forming a embedded polysilicon layer with removing the second insulating film (second silicon oxide film 16) so that the surface of the silicon substrate 10 is partially exposed and the polysilicon film 14 is partially remained only in the trench 13 (FIG. 2D).

Figure 2E:
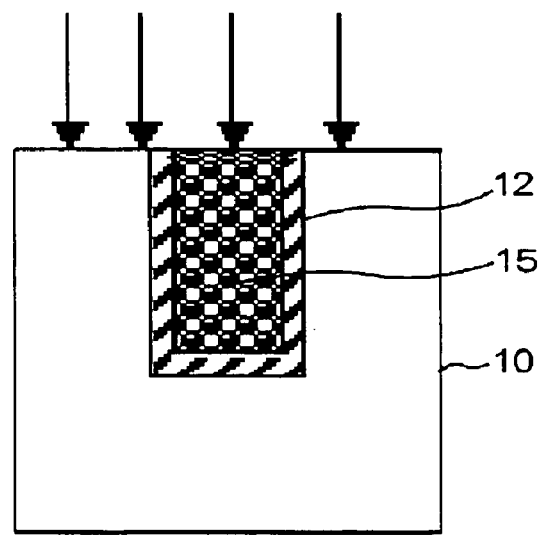
Figure 2F:
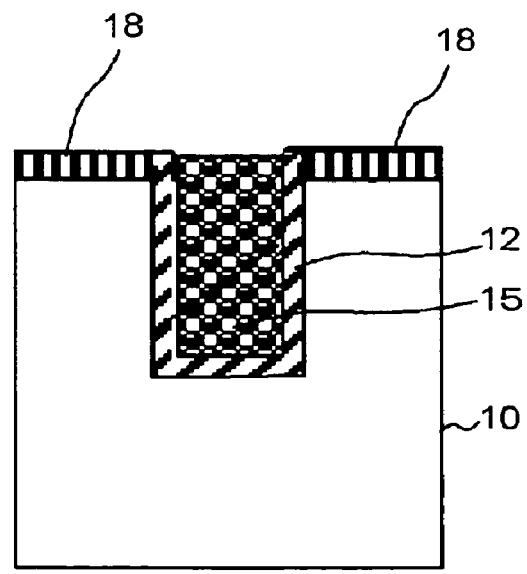

In the following embodiment, descriptions will be made in reference to an exemplary implementation of forming an embedded polysilicon layer as a polysilicon gate electrode. In this case, a step for forming a pair of source regions 18 in surface regions of the silicon substrate 10 located aside of the trench 13 is included after the step for forming the embedded polysilicon layer (FIG. 2D to FIG. 2F). The process for manufacturing the semiconductor device in the embodiment will be specifically described as follows, in reference to FIGS. 1A to 1C, FIGS. 2D to 2F and FIG. 3.

Figure 3:
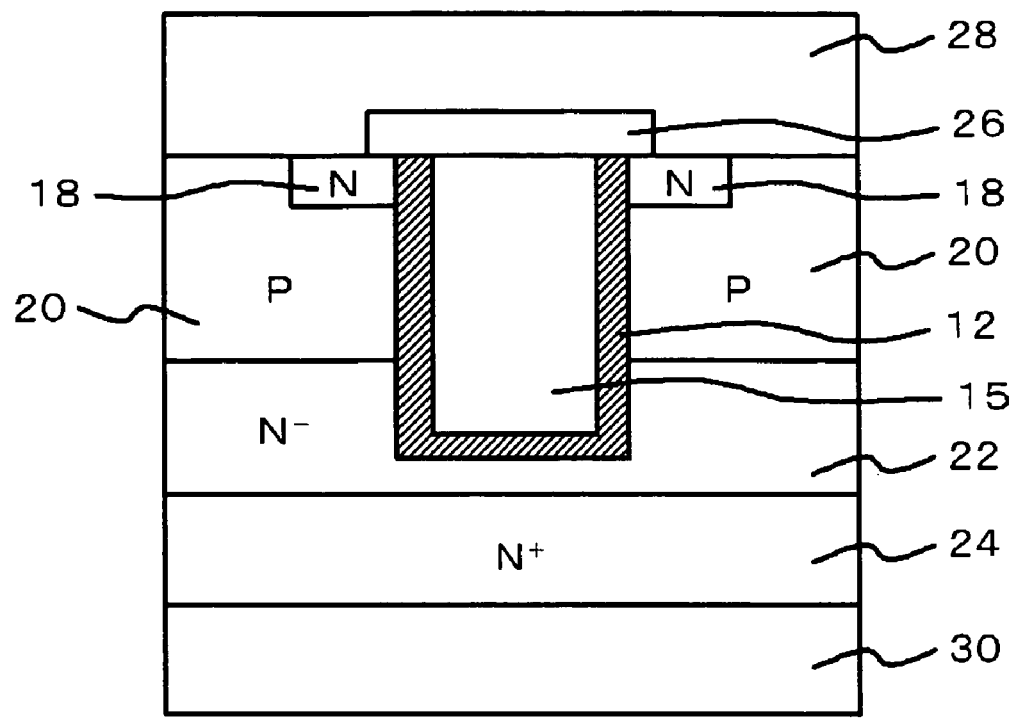
FIG. 3 is a cross-sectional view, schematically illustrating a vertical MOSFET manufactured in the embodiment according to the present invention.

First of all, a trench 13 is formed in a silicon substrate 10 via a conventional exposure technology and an etching technology. Then, a first silicon oxide film 12 is formed on a surface of the silicon substrate 10 including an interior wall of the trench 13 via a thermal oxidation process or the like (FIG. 1A). The first silicon oxide film 12 functions as a gate oxide film, and typically has a thickness of, for example, about 10 to 500 nm. Alternatively, the first silicon oxide film 12 may be formed on the interior wall of the trench 13 via a thermal oxidation process or the like, after the trench 13 is formed in the silicon substrate 10 having a silicon oxide film formed thereon. While the silicon substrate 10 is composed of an n+-type semiconductor layer 24 (hereinafter referred to as drain region) and an n−-type epitaxial layer 22, which are sequentially stacked, as shown in FIG. 3, the details of such configuration is not shown in FIGS. 1A to 1C and FIGS. 2D to 2F.

Subsequently, a polysilicon film 14 is formed on the surface of the silicon substrate 10 via a CVD process or the like. The polysilicon film 14 is formed so as to plug the inside of the trench 13 and to cover the entire surface of the silicon substrate 10 (FIG. 1B). If the thickness of polysilicon film 14 is equal to or larger than a half of an opening width of the trench 13, it is theoretically possible to fill the trench 13 therewith. However, since an etching process is conducted so as to form the surface of the polysilicon gate electrode 15 and the surface of the silicon substrate 10, both of which are coplanar, as discussed later, it is preferable to form the polysilicon film 14 to have a thickness, which is equal to or larger than the opening width of the trench 13. Taking fluctuations generated in the process into consideration, it is preferable to form the polysilicon film 14 to have a thickness, which is equal to or larger than two folds of the opening width of the trench 13. The opening width of trench 13 may be formed to be, for example about 0.1 to 1 µm. In such case, the thickness of the polysilicon film 14 is therefore provided to be about 0.2 to 2 µm, if the thickness of the polysilicon film 14 is determined to be two folds of the opening width of the trench 13.

Further, the polysilicon film 14 on the silicon substrate 10 is oxidized via a thermal oxidation process or the like to form a second silicon oxide film 16 on the surface of the silicon substrate 10. In the present embodiment, a description is made by illustrating an exemplary implementation of conducting the oxidization of the polysilicon film 14 via a thermal oxidation process. More specifically, a thermal oxidation of the polysilicon film 14 is carried out within a water vapor atmosphere of around 1,000 degree C. for a predetermined time. Such predetermined oxidization time is determined by conducting measurements employing a dummy wafer for different conditions of the thermal oxidation process. Such oxidization process provides that a portion of the polysilicon film 14 outside of the trench 13 on silicon substrate 10 is oxidized, and the surface regions of the silicon substrate 10 located right under the a first silicon oxide film 12 disposed outside of the trench 13 is also oxidized. At this occasion, the surface regions of the polysilicon film 14 formed in the trench 13 is also oxidized. The first silicon oxide film 12 has a thickness, which is considerably thinner as compared with an oxide film that is formed by oxidizing the surface region of the polysilicon film 14, and is an silicon oxide film similarly as the second silicon oxide film 16. Therefore, oxidization of the polysilicon film 14 is proceeded to reach the first silicon oxide film 12 formed on the surface of the silicon substrate 10, the second silicon oxide film 16 and the first silicon oxide film 12 is integrated. Then, the oxidization in the portion of the surface of the polysilicon film 14 in the trench 13 is proceeded to eventually oxide the whole thickness of first silicon oxide film 12, thereby providing the substantially equivalent thickness of the second silicon oxide film 16 in the inside and the outside of the trench 13. Then, further oxidization is continued, so that the portion of the silicon substrate 10 right under the first silicon oxide film 12 and the portion of the polysilicon film 14 right under the second silicon oxide film 16 are equivalently oxidized. More specifically, the surface of the silicon substrate 10 and the portion of the surface of the polysilicon film 14 in the trench 13 are oxidized while maintaining the coplanar relationship therebetween, thereby forming the second silicon oxide film 16. Therefore, such oxidization process provides the second silicon oxide film 16, so that the portion of the surface of the silicon substrate 10 located right under the silicon oxide film 16 is positioned to be substantially coplanar with the portion of the surface of the polysilicon film 14 in the trench 13 (FIG. 1C).

Then, the second silicon oxide film 16 is removed via an ordinary etch process to expose the surface the silicon substrate 10, and to leave the polysilicon film 14 only within the trench 13, thereby providing a polysilicon gate electrode 15. Since an etch rate for the second silicon oxide film 16 is different from a etch rate for the polysilicon film 14 or for the silicon substrate 10, only the second silicon oxide film 16 can be removed. This provides substantially planarized surface of the polysilicon gate electrode 15, and further provides substantially coplanar relationship between the surface of the polysilicon gate electrode 15 and the surface of the silicon substrate 10, resulting in preventing an exposure of the interior wall of the trench 13 (FIG. 2D). Alternatively, after the second silicon oxide film 16 is removed, a p-type impurity such as boron (B) and the like may be doped into a outer layer of the n-type epitaxial layer 22 through a mask of the first silicon oxide film 12 and the polysilicon gate electrode 15 formed in the trench 13, and then a thermally process may be conducted. Having this procedure, a p-type diffusion layer 20 is formed in the outer layer of the silicon substrate 10, as shown in FIG. 3.

Then, an n-type impurity such as arsenic (As), phosphorus (P) and the like is doped into the silicon substrate 10 through a mask of the first silicon oxide film 12 and the polysilicon gate electrode 15 formed in the trench 13 (FIG. 2E). Thereafter, a predetermined thermal processing is conducted to form a pair of n-type diffusion layers 18 (hereinafter referred to as source region) in the surface regions of the silicon substrate 10 located aside of the trench 13 (FIG. 2F).

Thereafter, a silicon oxide film is formed on the entire surface of the silicon substrate 10 to provide an insulating film, according to an ordinary process for manufacturing the conventional vertical metal oxide semiconductor field effect transistor (MOSFET), and then, an ordinary exposure process and an etch process are conducted to form an interlayer insulating film 26. Alternatively, the interlayer insulating film 26 may be formed in a surface layer of the polysilicon gate electrode 15 in the interior of the trench 13. Then, a source electrode 28 is formed on the front surface of the silicon substrate 10, and a drain electrode 30 is formed on the back surface of the silicon substrate 10 according to an ordinary process to form a vertical MOSFET (FIG. 3). Further, certain processes are additionally conducted to complete the process for manufacturing the semiconductor device.

Advantageous effects obtainable by employing the method for manufacturing the semiconductor device in the present embodiment will be described as follows.

According to the method for manufacturing the semiconductor device described above, the portion of the polysilicon film 14 outside of the trench 13 is oxidized, and the portion of the silicon substrate 10 located right under the silicon oxide film 12 disposed outside of the trench 13 is oxidized. According to such oxidization process, the surface of the polysilicon film 14 in the trench 13 can easily be substantially planarized, and further, the surface of the silicon substrate 10 and the surface of the polysilicon film 14 in the trench 13 are located to be substantially coplanar (FIG. 1C). Then, the second silicon oxide film 16 is removed via an ordinary etch process, so that the surface of the polysilicon gate electrode 15 in the trench 13 and the surface of the silicon substrate 10 are formed to be substantially coplanar (FIG. 2D).

Figure 4A:
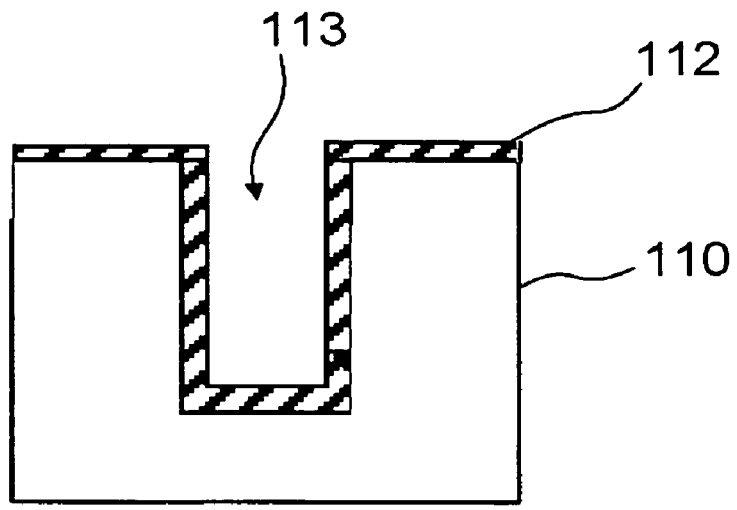
FIG. 4A to 4C are cross-sectional views of a semiconductor device, schematically illustrating a conventional process for manufacturing the semiconductor device for indicating a problem to be solved in the present invention.
Figure 4B:
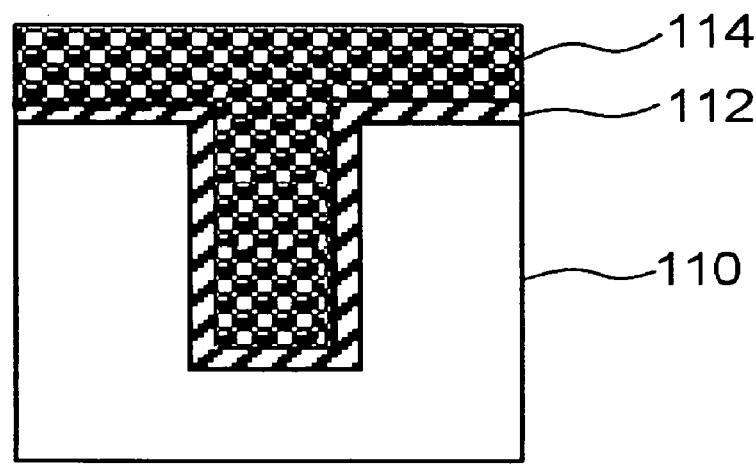
Figure 4C:
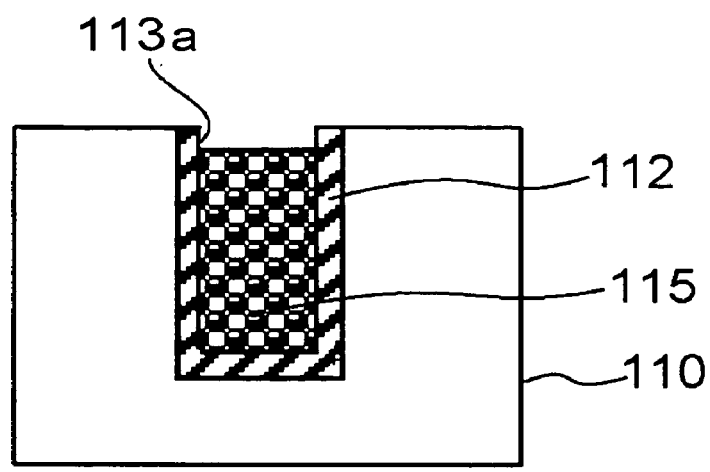
Figure 5D:
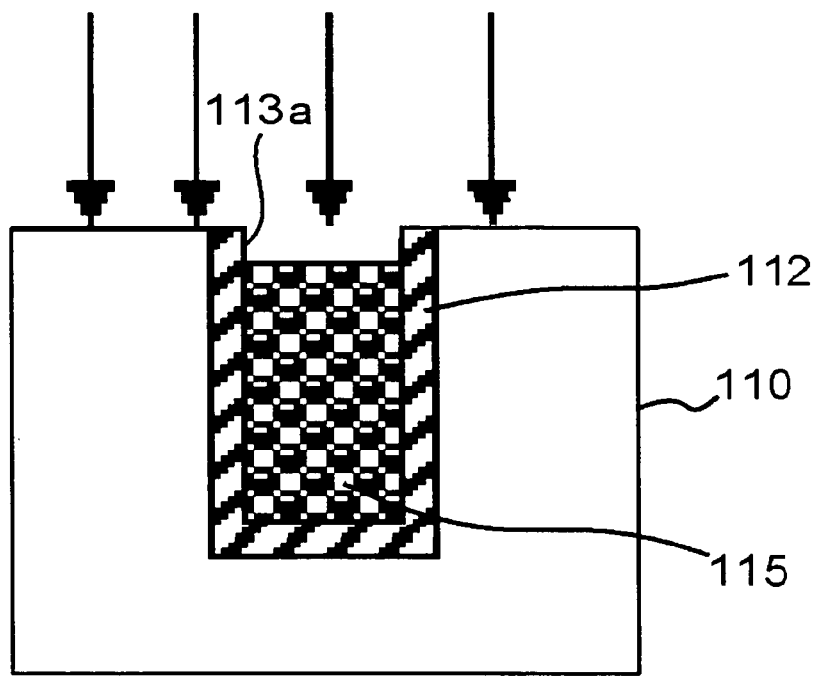
FIGS. 5D and 5E are cross-sectional views of the semiconductor device, schematically illustrating the conventional process for manufacturing the semiconductor device for indicating the problem to be solved in the present invention.
Figure 5E:
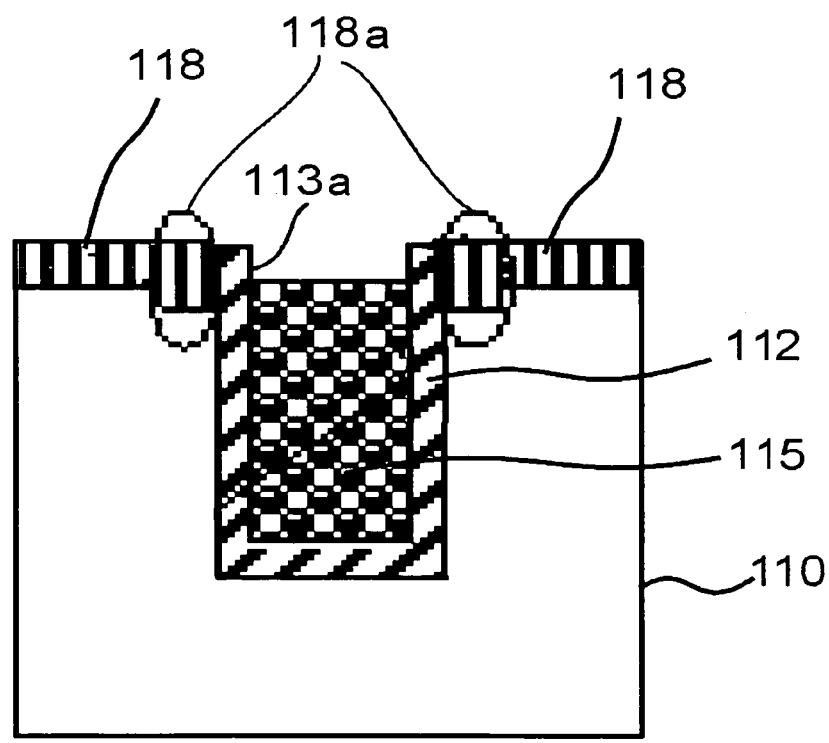
Figure 6A:
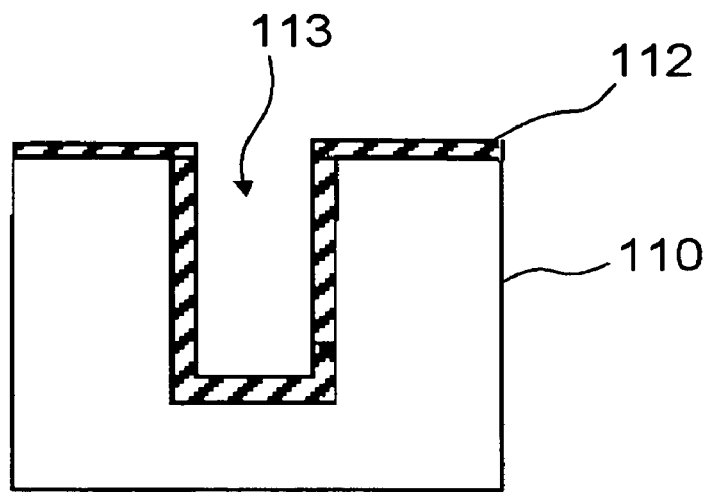
FIG. 6A to 6C are cross-sectional views of a conventional semiconductor device, schematically illustrating a conventional process for manufacturing the semiconductor device.
Figure 6B:
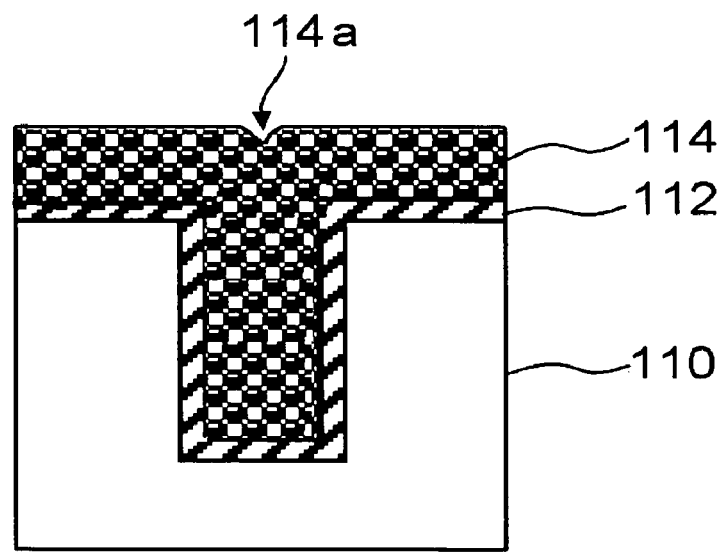
Figure 6C:
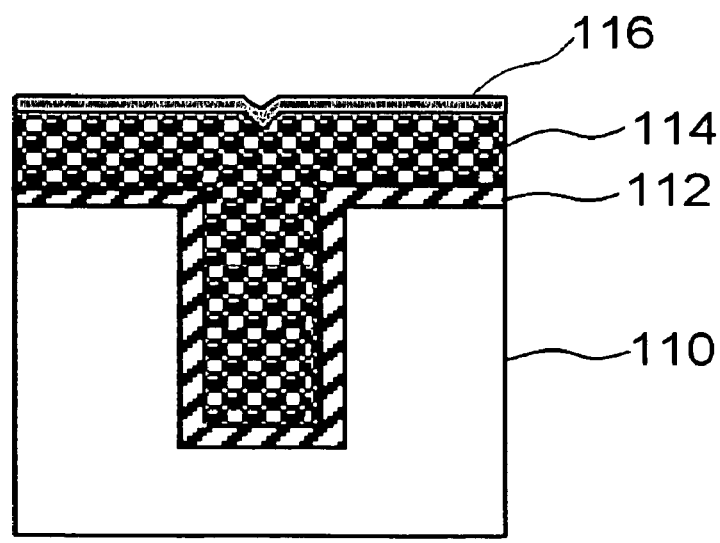
Figure 7D:
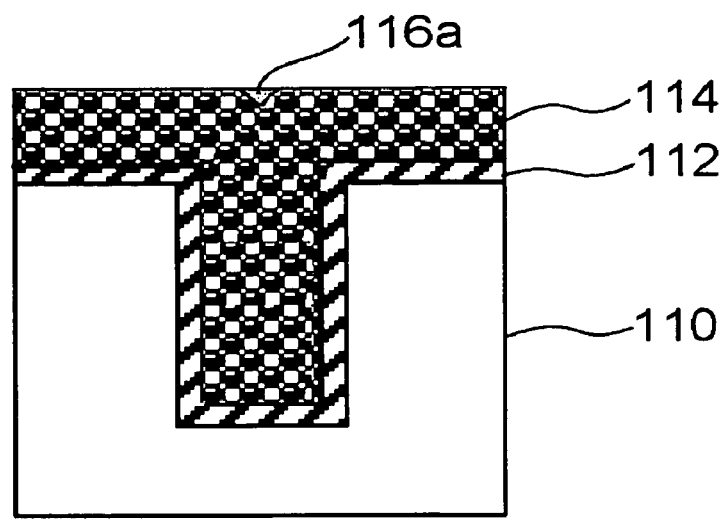
FIG. 7D to 7F are cross-sectional views of the conventional semiconductor device, schematically illustrating the conventional process for manufacturing the semiconductor device.
Figure 7E:
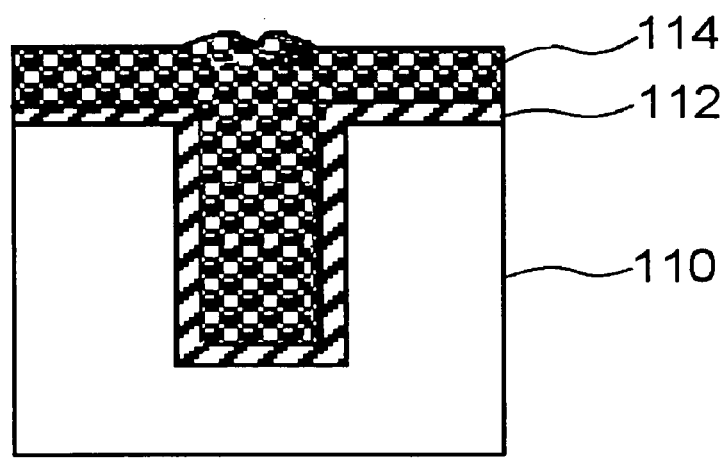
Figure 7F:
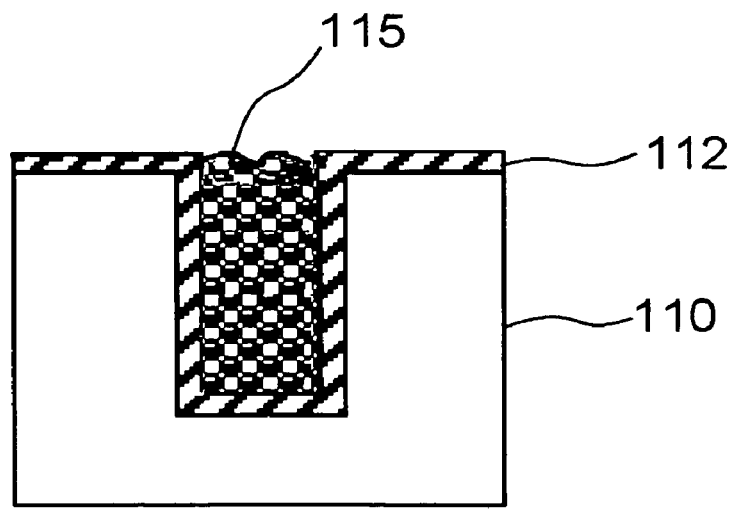

On the contrary, although a creation of the dips is inhibited by a very complicated operation to form the embedded polysilicon layer in the process described in Japanese Patent Laid-Open No. H06-314739, it is very difficult to precisely control the geometry of the surface of the embedded polysilicon layer, and further, the planarization thereof was not sufficient. More specifically, since the over etching of the polysilicon 114 is also essential for forming the embedded polysilicon layer 115 in Japanese Patent Laid-Open No. H06-314739, it is inevitable to partially expose the interior wall of the trench as shown in FIG. 4C. Accordingly, an anomalous diffusion region is inevitably formed in the source region.

On the contrary, according to the configuration of the present embodiment, the whole polysilicon film on the silicon substrate is oxidized. Therefore, the surface of the embedded polysilicon layer formed in the trench 13 and the surface of the silicon substrate 10 are formed to be substantially coplanar, such that the interior wall of the trench 13 is not exposed. That is, there is substantially no fear that an anomalous diffusion region is formed in the source region. Accordingly, stable threshold voltage of a transistor is achieved with a simple and easy process, and therefore a semiconductor device having stable electrical characteristics can be provided.

Further, even if an unwanted dip is once generated in the surface of the polysilicon film in the present embodiment, the dip is substantially disappeared in the oxidization process, such that the formation of the dip in the embedded polysilicon layer surface can be inhibited. More specifically, according to the present embodiment, the surface of the embedded polysilicon layer can be substantially planarized via a simple and easy process, such that an improved coupling reliability of an interconnect can be presented, when the embedded polysilicon layer is employed for a device isolation layer. In addition to above, it is sufficient to avoid forming a step in the interior wall of the trench 13 (a step formed by the surface of the silicon substrate 10 and the surface of the polysilicon film 14 in the trench 13), which may cause a formation of an anomalous diffusion in the source region, and therefore, even if some dips are remained in the surface of the polysilicon film in vicinity of a center of the trench 13, a stabilization in the threshold voltage of the transistor can be achieved.

While the preferred embodiments of the present invention have been described above in reference to the annexed figures, it should be understood that the disclosures above are presented for the purpose of illustrating the present invention, and various configurations other than the above described configurations can also be adopted.

For example, an embedded polysilicon layer may be formed as the device isolation layer by the method described in the present embodiment. More specifically, in the processes described above in reference to FIG. 1A to FIG. 1C and FIG. 2D, the conditions for the manufacturing process may be appropriately changed to form the embedded polysilicon layer as the device isolation layer. Since the substantially planarized surface of the embedded polysilicon layer can be easily provided according to the above-described alternative process, a connecting reliability is improved without causing a breakage of an interconnect, when the embedded polysilicon layer is employed as the device isolation layer.

In addition, when the second silicon oxide film 16 is removed via the etch process (FIG. 1C and FIG. 2D), the etch process may be conducted so as to partially leave the second silicon oxide film 16 on the surface of the polysilicon gate electrode 15. More specifically, in the oxidizing operation for forming the second silicon oxide film 16 (FIG. 1C), when the surface of the polysilicon gate electrode 15 is located to be lower than the surface of the silicon substrate 10, the etch process may be conducted so as to partially leave the second silicon oxide film 16 on the surface of polysilicon gate electrode 15, so that the surface of the second silicon oxide film 16 on the polysilicon gate electrode 15 and the surface of the silicon substrate 10 may be provided to be substantially coplanar. Therefore, the n-type diffusion layer is formed in a target region without exposing the interior wall of the trench 13, so that stable threshold voltage of a transistor is achieved, and thus a semiconductor device having stable electrical characteristics can be provided.

It is apparent that the present invention is not limited to the above embodiment, that may be modified and changed without departing from the scope and spirit of the invention.

What is claimed is:

1. A method for manufacturing a semiconductor device, comprising:
    forming a trench in a silicon substrate;
    forming a first insulating film on a surface of said silicon substrate, said surface including an interior wall of said trench;
    forming a polysilicon film which plugged in said trench and covered on an entire surface of said silicon substrate;
    forming a second insulating film with oxidizing a portion of said polysilicon film disposed outside of said trench, and oxidizing a surface region of said silicon substrate located right under said first insulating film disposed outside of said trench and a surface region of said polysilicon film in said trench; and
    forming an embedded polysilicon layer with removing said second insulating film so that the surface of said silicon substrate is partially exposed and said polysilicon film is partially remained in said trench.

2. The method for manufacturing the semiconductor device according to claim 1, wherein said forming an embedded polysilicon layer includes removing said second insulating film so that the surface of said embedded polysilicon layer and the surface of said silicon substrate are substantially coplanar.

3. The method for manufacturing the semiconductor device according to claim 1, wherein said embedded polysilicon layer is a polysilicon gate electrode.

4. The method for manufacturing the semiconductor device according to claim 3, wherein said method further includes forming a pair of source regions in surface regions of said silicon substrate located aside of said trench, after said removing said second insulating film.

5. The method for manufacturing the semiconductor device according to claim 1, wherein said first and second insulating films are silicon oxide films.

* * * * *